US009754893B2

(12) United States Patent
Ding et al.

(10) Patent No.: US 9,754,893 B2
(45) Date of Patent: Sep. 5, 2017

(54) SEMICONDUCTOR STRUCTURE AND FABRICATION METHOD THEREOF

(71) Applicant: Semiconductor Manufacturing International (Shanghai) Corporation, Shanghai (CN)

(72) Inventors: Jingxiu Ding, Shanghai (CN); Zuopeng He, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/861,139

(22) Filed: Sep. 22, 2015

(65) Prior Publication Data

US 2016/0093601 A1 Mar. 31, 2016

(30) Foreign Application Priority Data

Sep. 29, 2014 (CN) .......................... 2014 1 0514075

(51) Int. Cl.

| | |
|---|---|
| ***H01L 23/544*** | (2006.01) |
| ***H01L 21/68*** | (2006.01) |
| ***H01L 23/00*** | (2006.01) |
| ***H01L 25/065*** | (2006.01) |
| ***H01L 25/00*** | (2006.01) |

(52) U.S. Cl.

CPC ............ *H01L 23/544* (2013.01); *H01L 21/68* (2013.01); *H01L 24/03* (2013.01); *H01L 24/09* (2013.01);

(Continued)

(58) Field of Classification Search

CPC ......... H01L 21/50; H01L 21/58; H01L 21/68; H01L 21/683; H01L 21/70; H01L 21/76897; H01L 23/147; H01L 23/48; H01L 23/488; H01L 23/498; H01L 23/49816; H01L 23/544; H01L 24/03; H01L 24/06; H01L 24/09; H01L 24/10; H01L 24/11; H01L 24/14; H01L 24/17;

(Continued)

(56) References Cited

U.S. PATENT DOCUMENTS 3,811,186 A * 5/1974 Larnerd .................. H01L 24/81 174/253
6,605,524 B1 * 8/2003 Fan ......................... H01L 24/11 257/E21.508

(Continued)

*Primary Examiner* — Eduardo A Rodela
(74) *Attorney, Agent, or Firm* — Anova Law Group, PLLC

(57) ABSTRACT

Semiconductor structure and fabrication methods are provided. The semiconductor structure includes a first wafer having a first metal layer therein and having a first material layer thereon, and a second wafer having a second metal layer therein and having a second material layer thereon. An alignment process and a bonding process are preformed between the first wafer and the second wafer, such that the first material layer and the second material layer are aligned and in contact with one another to provide a first alignment accuracy between the first metal layer and second metal layer. A heating process is performed on the first material layer and the second material layer to melt the first material layer and the second material layer to provide a second alignment accuracy between the first metal layer and second metal layer. The second alignment accuracy is greater than the first alignment accuracy.

10 Claims, 7 Drawing Sheets

203 201 200 202 206 306 302 303 301 300

(52) U.S. Cl.
CPC .......... *H01L 24/89* (2013.01); *H01L 25/0657* (2013.01); *H01L 25/50* (2013.01); *H01L 2224/03618* (2013.01); *H01L 2224/05111* (2013.01); *H01L 2224/05113* (2013.01); *H01L 2224/05116* (2013.01); *H01L 2224/05139* (2013.01); *H01L 2224/08145* (2013.01); *H01L 2224/8013* (2013.01); *H01L 2224/80203* (2013.01); *H01L 2224/80801* (2013.01); *H01L 2225/06513* (2013.01); *H01L 2225/06541* (2013.01); *H01L 2225/06593* (2013.01); *H01L 2924/0132* (2013.01); *H01L 2924/0133* (2013.01); *H01L 2924/20104* (2013.01); *H01L 2924/20105* (2013.01); *H01L 2924/20106* (2013.01); *H01L 2924/20107* (2013.01); *H01L 2924/20108* (2013.01); *H01L 2924/20109* (2013.01)

(58) Field of Classification Search
CPC ......... H01L 24/26; H01L 24/27; H01L 24/30; H01L 24/33; H01L 24/93; H01L 24/94
See application file for complete search history.

(56) References Cited

U.S. PATENT DOCUMENTS 7,557,452 B1 * 7/2009 Williams .......... H01L 23/49811 257/697
2004/0026484 A1 * 2/2004 Yamashita ........... B23K 1/0016 228/180.22
2004/0108135 A1 * 6/2004 Ashida ................ H01L 23/3128 174/260
2007/0001280 A1 * 1/2007 Hua .................... H01L 21/4846 257/686
2009/0090950 A1 * 4/2009 Forbes .................... H01L 24/13 257/301
2013/0168850 A1 * 7/2013 Samoilov .......... H01L 21/76898 257/737
2014/0217557 A1 * 8/2014 Chen ................... B81C 1/00269 257/620
2015/0054154 A1 * 2/2015 Jitjongruck ............. H01L 24/29 257/738
2015/0366079 A1 * 12/2015 Matsuda ................ B23K 1/008 219/72

* cited by examiner

SEMICONDUCTOR STRUCTURE AND FABRICATION METHOD THEREOF

CROSS-REFERENCES TO RELATED APPLICATIONS

This application claims priority to Chinese Patent Application No. CN201410514075.1, filed on Sep. 29, 2014, the entire content of which is incorporated herein by reference.

FIELD OF THE DISCLOSURE

The present disclosure relates to the field of semiconductor manufacturing technologies and, more particularly, relates to semiconductor structure and fabrication method thereof.

BACKGROUND

With rapid development of semiconductor manufacturing technology, semiconductor chips are desirable to have high degree of integration such that semiconductor devices may provide faster computing speed, greater data storage capacity and more features. The semiconductor chips having a higher degree of integration may provide smaller critical dimension (CD) of the semiconductor devices.

Three-dimensional integrated circuits (3-D ICs) may be formed by stacking chips together using advanced technology. Various chips with different functions may be stacked into an integrated circuit having a three-dimensional structure. Compared with a two-dimensional (2-D) structured ICs, the stacking technology for the three-dimensional integrated circuits may allow shortened signal transmission path and accelerated operational speed. In short, 3-D IC stacking technology has advantages including higher performance, smaller size, lower power consumption, and other function for semiconductor devices.

Connection methods between three-dimensional integrated circuit chips include metal wire bonding and flip-chip wafer bonding. Compared with metal wire bonding, the flip-chip wafer bonding has shorter electrical connection path in addition to providing more excellent thermal properties, electrical properties, and smaller structural dimensions. The flip-chip wafer bonding technology is currently, widely used for temporary or permanent bonding between different chips.

The flip-chip wafer bonding technology includes: silicon-silicon direct bonding, silicon-glass electrostatic bonding, and metal-metal bonding. Metal-metal bonding may use pure metal or metal alloy to bond surfaces of two wafers together via intermetallic diffusion, diffusion between metal and wafer, metal molten etc.

BRIEF SUMMARY OF THE DISCLOSURE

According to various embodiments, there is provided a method for forming a semiconductor structure by providing a first wafer and a second wafer. A first metal layer is formed in the first wafer and has a top surface exposed. A second metal layer is formed in the second wafer and has a top surface exposed. A first material layer is formed on the first wafer, and the first material layer and the first metal layer are on a same side of the first wafer. A second material layer is formed on the second wafer, and the second material layer and the second metal layer are on a same side of second wafer. An alignment process and a bonding process are preformed between the first wafer and the second wafer, such that the first material layer and the second material layer are aligned and in contact with one another to provide a first alignment accuracy between the first metal layer and second metal layer. After the bonding process, a heating process is performed on the first material layer and the second material layer, such that the first material layer and the second material layer are melted into one another to provide a second alignment accuracy between the first metal layer and second metal layer. The second alignment accuracy is greater than the first alignment accuracy.

According to various embodiments, there is also provided a semiconductor structure. The semiconductor structure includes a first wafer having a first metal layer therein and having a first material layer thereon. A top surface of the first metal layer is exposed, and the first material layer and the first metal layer are on a same side of the first wafer. The semiconductor structure also includes a second wafer having a second metal layer therein and having a second material layer thereon. A top surface of the second metal layer is exposed, and the second material layer and the second metal layer are on a same side of the second wafer. The first wafer and the second wafer are bonded together having the first material layer of the first wafer and the second material layer of the second wafer aligned and in contact with one another to provide an alignment accuracy between the first metal layer and second metal layer.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
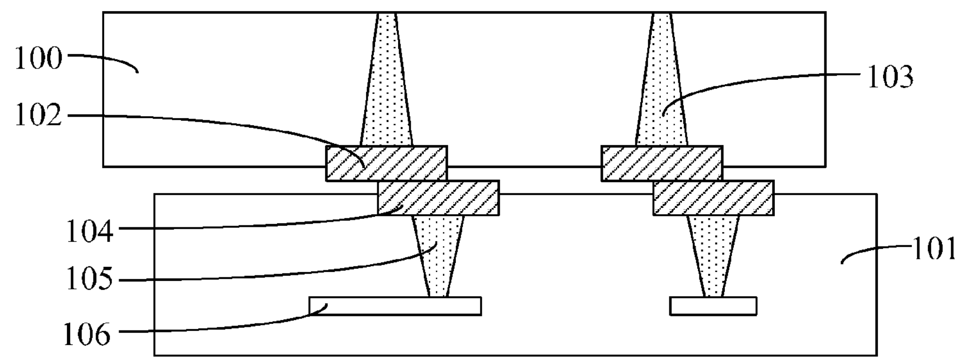
FIG. 1 depicts an exemplary semiconductor device in accordance with various disclosed embodiments.

FIG. 1 depicts an exemplary semiconductor device in accordance with various disclosed embodiments.

As shown in FIG. 1, a first wafer 100 is provided. A first plug 103 is formed in the first wafer 100. The first wafer 100 further contains a first metal layer 102 having one end electrically connected to the first plug 103. The first metal layer 102 has the other end protruded above a surface of the first wafer 100.

A second wafer 101 is provided and contains a second plug 105. The second wafer also contains a second metal layer 104 having one end electrically connected to the second plug 105. The second metal layer 104 has the other end protruded above a surface of the second wafer 101.

The first wafer 100 and the second wafer 101 are aligned by an alignment process, followed by a bonding process. The first metal layer 102 is in close contact with the second metal layer 104 to thus bond the first wafer 100 and the second wafer 101 together. The first wafer 100 is electrically connected with the second wafer 101.

However, after the bonding process between the first wafer 100 and the second wafer 101, it is often found that the first metal layer 102 of the first wafer 100 is not precisely or accurately aligned with the second metal layer 104 of the second wafer 101. Bonding shift may occur to have portions from the first metal layer 102 and the second metal layer 104 miss-bonded with one another. The bonding shift may thus be mainly caused by non-accurate alignment. Degree of the bonding shift is directly related to the alignment accuracy. A high alignment accuracy may result in a low degree of the bonding shift. It is desirable to improve alignment accuracy between the wafers to reduce the bonding shift.

The present disclosure provides a method for forming a semiconductor structure. A first material layer is formed on the first wafer. The first material layer and the first metal layer are located on the same side or same surface of the first wafer. A second material layer is formed on the second wafer. The second material layer and the second metal layer are located on the same side or same surface of the second wafer.

The first wafer and second wafer are aligned and bonded by an alignment process and a bonding process, such that the first material layer and the second material layer are aligned with one another and surfaces thereof are in contact with one another. After performing the alignment process, a first alignment accuracy between the first metal layer and second metal layer is provided. After performing the bonding process, the first material layer and the second material layer are heated and melted (or fused) into one another to provide a second alignment accuracy between the first metal layer and second metal layer.

The melting of the first material layer and/or the second material layer may produce surface tension, which may pull the first material layer and the second material layer closer, thereby pulling the first metal layer and second metal layer closer for self-alignment. The second alignment accuracy is thus greater than the first alignment accuracy and thus improves the alignment accuracy between the first wafer and the second wafer to reduce or eliminate bonding shift along with adverse effects brought by the bonding shift.

FIGS. 2-9 depict an exemplary method for forming a semiconductor structure in accordance with various disclosed embodiments. Structures at various stages during its formation may be provided.

Figure 2:
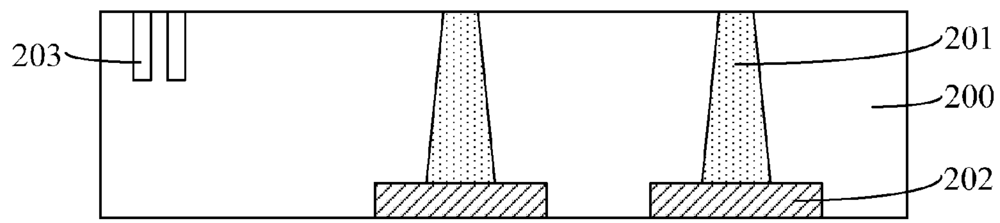
FIGS. 2-9 depict an exemplary method for forming a semiconductor device in accordance with various disclosed embodiments.

Referring to FIG. 2, a first wafer 200 is provided having a first surface and a second surface opposing the first surface. A first metal layer 202 is formed in the first wafer 200 and having a top surface coplanar with the top surface of the first wafer 200.

For illustration purposes, the surface of the first wafer 200 close to the first metal layer 202 is referred to as a first surface, and a first material layer is subsequently formed on the first surface of the first wafer 200.

The first wafer 200 may be a single layer wafer or a multilayer wafer. The first wafer 200 is made of a material selected from one or more of silicon, germanium, silicon germanium, silicon carbide, gallium arsenide, and silicon oxide. Within the first wafer 200, semiconductor devices, e.g., CMOS transistors, PMOS transistors, NMOS transistors, resistors, capacitors and/or inductors, may be formed.

In one embodiment, a first plug 201 is formed in the first wafer 200. A bottom surface of the first plug 201 is coplanar with the second surface of the first wafer 200. A top surface of the first plug 201 is electrically connected with a bottom surface of the first metal layer 202. As used herein, the bottom surface of the first metal layer 202 is referred to the surface of the first metal layer 202 away from the first surface of the first wafer 200.

In order to facilitate the subsequent alignment process, a first alignment structure 203 may be formed within the first wafer 200. A subsequently provided second wafer may contain a second alignment structure. When performing the alignment process, the first and second alignment structures may be aligned with one another to complete the alignment between the first wafer 200 and the second wafer.

In certain embodiment, the first metal layer 202 is formed by first forming a patterned photoresist layer on the first surface of the first wafer 200. The patterned photoresist layer is used as an etch mask to etch and remove a thickness portion of the first wafer 200 until a top surface of the first plug 201 is exposed. A groove may be formed in the first wafer 200 and filled with a metal film. The metal film also covers the first surface of the first wafer 200. The metal film is then planarized to remove metal film that is located on the first surface of the first wafer 200 to form the first metal layer 202 filled in the groove. The top surface of the first metal film 202 and the first surface of the first wafer 200 are coplanar with one another.

Although for illustration purposes, the top surface of the first metal layer 202 is coplanar with the first surface of the first wafer 200, the present disclosure also includes, in other embodiments, the top surface of the first metal layer 202 may be above the first surface of the first wafer 200. The first metal layer 202 may be made of Cu, Al, Au, W, and/or Ag.

Figure 3:
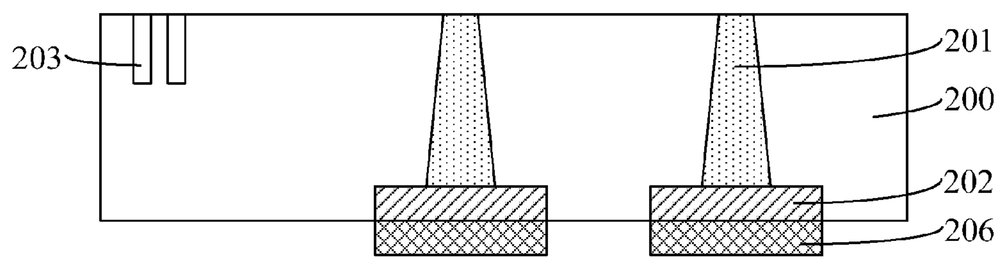

In FIG. 3, a first material layer 206 is formed on the surface of the first wafer 200. The first material layer 206 and the first metal layer 202 are located on the same side of the first wafer 200.

In one embodiment, the first material layer 206 and the first metal layer 202 are located on the first surface of the first wafer 200. The first material layer 206 may partially or wholly cover the top surface of the first metal layer 202. The first material layer 206 may be conductive.

After subsequently providing a second wafer, a second material layer may be formed on the surface of the second metal layer on the second wafer. The first material layer 206 and the second material layer may be made of material(s) having low melting points. After bonding the first wafer 200 with the second wafer, the first wafer 200 and the second wafer are heated, so that first material layer 206 and the second material layer become in a molten state. The first material layer 206 and the second material layer in the molten state may provide a surface tension between the first material layer 206 and second material layer. Such surface tension may pull the first material layer 206 and the second material layer to closer to improve the alignment accuracy between the first wafer 200 and the second wafer to reduce or eliminate occurrence of bonding shift.

In one embodiment, the melting point of the first material layer 206 is directly related to temperatures used for the subsequent bonding process and heating process. Specifically, in order to ensure the first material layer 206 and the second material layer does not melt during the bonding process, the first material layer 206 is required to have a melting point greater than the temperature for the bonding process. On the other hand, in order to ensure the first material layer 206 and the second material layer to be melted or fused into one another during the heating process, the first material layer 206 is required to have the melting point less than the temperature used for the heating process.

When the melting point of the first material layer 206 is too low, a relatively low temperature may be used in the subsequent bonding process, accordingly. This may result in poor, undesirable bonding strength between the first wafer 200 and the second wafer. The first wafer 200 may be easily separated from the second wafer. In addition, the semiconductor structure, while in a working condition, may produce a certain amount of heat to increase temperature of the semiconductor structure. When the melting point of the first material layer 206 is too low, the semiconductor structure in working condition may likely cause the first material layer 206 to be melted.

When the melting point of the first material layer 206 is too high, a relatively high temperature may be used in the subsequent heating process, accordingly. The heating process performed under a high temperature may likely cause device failure within the resultant semiconductor structure. As such, the melting point of the first material layer 206 may be controlled to be about 100° C. to about 350° C.

The first material layer 206 may include tin-silver alloy, tin-lead alloy, bismuth silver alloy, tin-bismuth alloy, and/or tin-bismuth-lead alloy. In a specific embodiment, the first material layer 206 includes an alloy of tin and silver. The first material layer 206 may have a thickness of about 0.1 micron to about 10 microns.

The first material layer 206 may be formed by an electrochemical plating method. For example, before forming the first material layer 206 by the electrochemical plating, a first seed layer may be formed on the surface of the first wafer 200. The first seed layer may prepare the surface for the electrochemical plating process. In one embodiment, the thickness of the first seed layer may be about 100 angstroms to about 1000 angstroms.

To form the first material layer 206, the first seed layer (not shown) may be formed to cover the surface (e.g., the first surface) of the first wafer 200. The first seed layer may partially or wholly cover the top surface of the first metal layer 202. A first patterned photoresist layer may then be formed over the first seed layer to expose the first seed layer that is on the first metal layer 202. The first material layer 206 is formed on the exposed surface of the first seed layer, followed by removal of the first resist layer and first seed layer underlying the first resist layer.

In one embodiment, the first material layer 206 only covers the top surface of the first metal layer 202. In other words, the first material layer 206 may have a dimensions/area consistent with the dimensions/area of the first metal layer 202. In doing this, when the dimensions/area of the first material layer 206 possibly changes during subsequent processes, e.g., become larger, the consistent dimensions/area between the first material layer 206 and the first metal layer 202 may prevent undesirable electrical connection between adjacent first material layers 206.

In other embodiments, when a distance between adjacent first metal layers is large, the size of the first material layer may be larger than the size of the first metal layer. That is, in addition to covering the top surface of the first metal layer, the first material layer may also cover surface portions of the first wafer located near the first metal layer.

Figure 4:
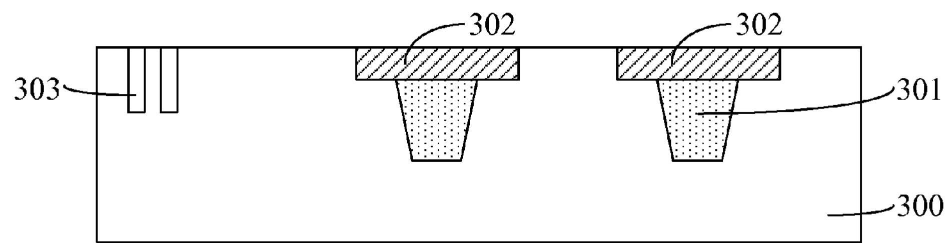

In FIG. 4, a second wafer 300 is provided. The second wafer 300 has a third surface and a fourth surface opposing the third surface. A second metal layer 302 is formed within the second wafer 300. The second metal layer 302 has a top surface exposed via the third surface of the second wafer 300.

For illustration purposes, the surface of the second wafer 300 close to the top surface of the second metal layer 302 is referred to as a third surface. When subsequently bonding the first wafer 200 (e.g., see FIG. 3) with the second wafer 300, the first surface of the first wafer 200 and the third surface of the second wafer 300 may be bonded.

In various embodiments, the second wafer 300 may be same as or similar to the first wafer 200.

In one embodiment, a second plug 301 is formed within the second wafer 300. A bottom of the second plug 301 is located within the second wafer 300. The top surface of the second plug 301 is electrically connected to the bottom surface of the second metal layer 302. As used herein, the bottom surface of the second metal layer 302 is referred to as the surface of the second metal layer 302 away from the third surface of the second wafer 300.

In one embodiment, as an example, the top surface of the second metal layer 302 and the third surface of the second wafer 300 may be coplanar with one another. In other embodiments, the top surface of the second metal layer 302 may be above the third surface of the second wafer 300. The material of the second metal layer 302 may include Cu, Al, Au, W, and/or Ag.

A second alignment structure 303 may be formed in the second wafer 300. During the subsequent alignment process, by aligning the first alignment structure 203 (e.g., see FIG. 3) with the second alignment structure 303, the alignment process may be performed between the first wafer 200 and the second wafer 300.

Figure 5:
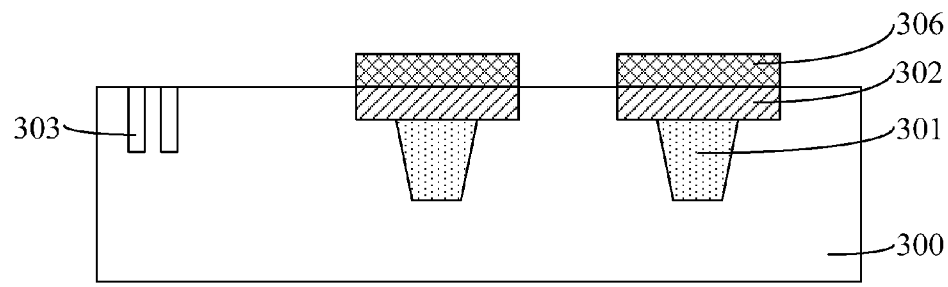

In FIG. 5, a second material layer 306 is formed on surface of the second wafer 300, and the second material layer 306 and second metal layer 302 are located on the same side or surface of the second wafer 300.

In one embodiment, the second material layer 306 and the second metal layer 302 are located on the third surface of the second wafer 300. The second material layer 306 covers the top surface of the second metal layer 302, and the second material layer 306 is conductive.

Similar to the first material layer 206, the second material layer 306 may have a low melting point. The second material layer 306 may include tin-silver alloy, tin-lead alloy, bismuth-silver alloy, tin-bismuth alloy, and/or tin-bismuth-lead alloy.

In one embodiment, the second material layer 306 has a melting point ranging from about 100° C. to about 350° C. In one embodiment, to reduce process difficulties, the first material layer 206 and the second material layer material 306 may be formed using same material(s). In another embodiment, the second material layer and the first material layer may be formed using different materials.

In one embodiment, as an example, the second material layer 306 covers only the top surface of the second metal layer 302. In other words, the second material layer 306 may have dimensions/area consistent with the dimensions/area of the second metal layer 302.

Figure 6:
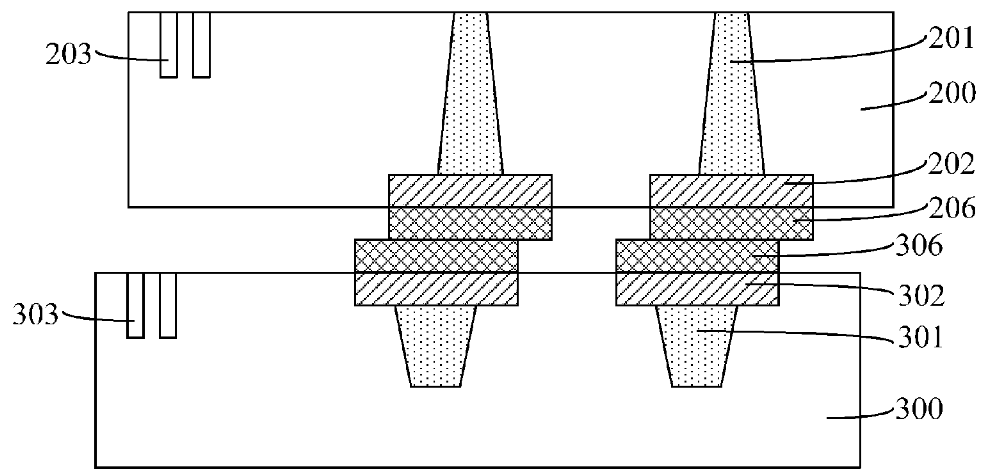

In FIG. 6, an alignment process is perform between the first wafer 200 and the second wafer 300, such that the first material layer 206 and the second material layer 306 are aligned with one another. After the alignment process, a bonding process is performed on the first wafer 200 and the second wafer 300, such that the first material layer 206 is aligned with and in contact with the second material layer 306 to provide a first alignment accuracy between the first metal layer 202 and second metal layer 302.

The alignment accuracy reflects a degree of alignment between the first metal layer 202 and the second metal layer 302 and thus between the first and second wafers. To determine the alignment accuracy, a first dimension (or area) is determined by an overlapping dimension (or area) between the first metal layer 202 and the second metal layer 302. A second dimension (or area) is determined by a dimension (or area) of either the first metal layer 202 or the second metal layer 302. The alignment accuracy is determined by a ratio of the first dimension (or area) over the second dimension (or area). The term "100% alignment accuracy" indicates a "complete alignment" between the first metal layer 202 and second metal layer 302. For a complete alignment, corresponding sidewalls of the first metal layer 202 and second metal layer 302 may be completely flushed or coplanar with one another.

As such, prior to the bonding process, the alignment process is performed to align the first alignment structure 203 with the second alignment structure 303. Ideally, the first wafer 200 may be completely aligned with the second wafer 300 to provide a first alignment accuracy of about 100%. However, due to constraints of the alignment process and the small sized wafer, after performing the alignment process, it is still difficult to eliminate aligning error between the first alignment structure 203 and the second alignment structure 303. This may result in an alignment error occurring between the first material layer 206 and the second material layer 306. That is, the first material layer 206 and the second material layer 306 may be missed with one another having surfaces of corresponding sidewalls non-coplanar. The first alignment accuracy may thus need to be further improved.

In one embodiment, the first surface of the first wafer 200 and the third surface of the second wafer 300 may be bonded by the bonding process.

In one embodiment, thermo-compression bonding process may be used for the bonding process. In this case, the bonding process may be carried out at the first temperature. When performing the bonding process, a pressure may be applied onto the backside of the first wafer 200 (e.g., the second surface of the first wafer 200). The pressure may be applied in a direction from the backside of the first wafer 200 to an opposite side such as the first surface of the first wafer 200. After the bonding process, the first material layer 206 may be in close contact with the second material layer 306.

When the first temperature is too low, the contact between the first material layer 206 and the second material layer 306 may not be tight enough. During subsequent processes, the first material layer 206 and the second material layer 306 may be easily separated from one another. When the first temperature is too high, the first material layer 206 and the second material layer 306 may be melted and fused into one another during the bonding process. In this case, under further pressure, the surface tension generated between the first material layer 206 and the second material layer 306 may provide limited effect. That is, under such surface tension, the first material layer 206 and second material layer 306 may not be sufficiently close with one another and may not facilitate improvement of alignment accuracy between the first wafer 200 and the second wafer 300. As such, the first material layer 206 may have a melting point greater than the first temperature. In one embodiment, the first temperature is about 100° C. to about 250° C.

Figure 7:
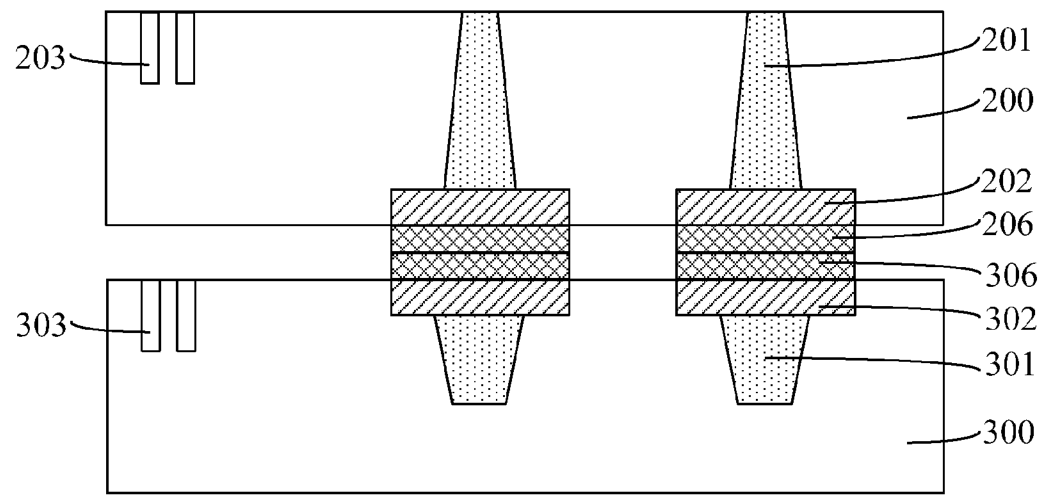

In FIG. 7, after performing the bonding process, a heating process is performed to the first material layer 206 and the second material layer 306. The first material layer 206 and the second material layer 306 are melted and fused into one another to provide the first metal layer 202 and second metal layer 302 with a second alignment accuracy. The second alignment accuracy is greater than the first alignment accuracy, so that the first metal layer 202 is aligned with the second metal layer 302.

The first alignment accuracy is provided after the bonding process between the first metal layer 202 and second metal layer 302 and the first alignment accuracy may need to be improved. The disclosed heating process may then improve the alignment accuracy between the first material layer 206 and the second material layer 306, and thus between the first metal layer 202 and the second metal layer 302, and further between the first wafer 200 and the second wafer 300. In other words, the second alignment accuracy is greater than the first alignment accuracy to reduce or even eliminate the issues caused by bonding shift and to reduce or avoid the adverse effects caused by bonding shift.

The heating process is carried out at a second temperature and the second temperature is greater than the first temperature for the bonding process. In one embodiment, the first material layer 206 and the second material layer 306 may have the same or different melting points greater than the first temperature but less than second temperature.

When the second temperature is too low, it is difficult for the first material layer 206 and the second material layer 306 to arrive at a molten state during the heating process. When the second temperature is too high, it may destroy the devices formed in the semiconductor structure. In one embodiment, the second temperature may be controlled to be about 200° C. to about 350° C.

Since the second temperature is greater than melting point(s) of the first material layer 206 and the second material layer 306, the first material layer 206 and the second material layer 306 may be melted and fused into one another in the heating process. The first material layer 206 and second material layer 306 in the molten state may have a surface tension. Under the surface tension, the first material layer 206 and the second material layer 306 may be pulled closer, thereby enhancing the alignment accuracy between first material layer 206 and the second material layer 306, between the first metal layer 202 and the second metal layer 302, and between the first wafer 200 and second wafer 300. Such second alignment accuracy is greater than the first alignment accuracy, to reduce or eliminate bonding shift between the first wafer 200 and the second wafer 300, thereby enabling corresponding sidewall surfaces of the first metal layer 202 and second metal sidewall layer 302 to be coplanar with one another.

As illustrated in FIG. 7, for the semiconductor structure after a heating process, dimensions or areas of the first material layer 206 and the second material layer 306 may remain substantially unchanged, and the first metal layer 202 and the second metal layer 302 may have coplanar sidewall surfaces. The second alignment accuracy is approximately 100%, which significantly improves alignment accuracy between the first wafer 200 and the second wafer 300, and eliminates bonding shift issues.

Figure 8:
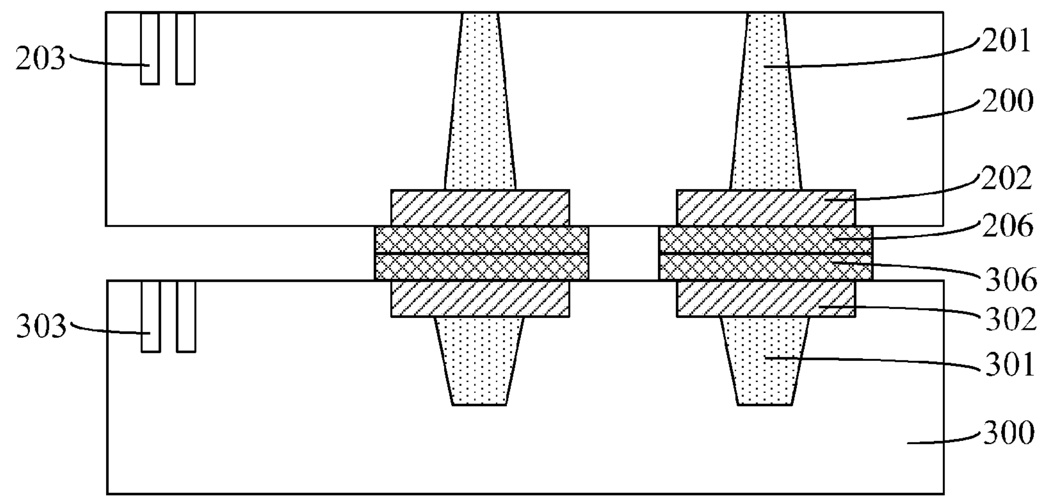

FIG. 8 illustrates another exemplary semiconductor structure after a heating process. In this case, dimensions or areas of the first material layer 206 and the second material layer 306 may be changed to be larger. For example, the first material layer 206 may be larger than the first metal layer 202, and the second material layer 306 may be larger than the second metal layer 302, while surfaces of corresponding sidewalls of the first metal layer 202 and second metal layer 302 are flush or coplanar with one another.

In one embodiment, before the heating process, the first material layer 206 only covers the top surface of the first metal layer 202, the second material layer 306 only covers the top surface of the second metal layer 302. Therefore, distance between adjacent first material layers 206, distance between adjacent second material layers 306 may be sufficiently large, to prevent electrical connection caused by the increased dimensions of the first material layer 206 and the second material layer 306 after the heating process.

Figure 9:
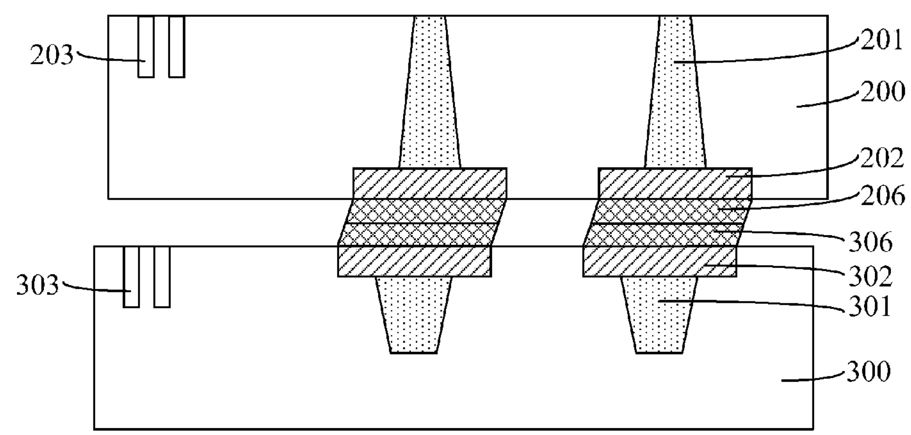

FIG. 9 illustrates another exemplary semiconductor structure after a heating process to enable alignment between the first metal layer 202 and second metal layer 302. In the process of heating process, due to effect of surface tension between the first material layer 206 and the second material layer 306, the first metal layer 202 and the second metal layer 302 may be pulled closer. Compared with the structure prior to the heating process, alignment accuracy between the first metal layer 202 and the second metal layer 302 is improved, and the second alignment accuracy is greater than first alignment accuracy. Bonding shift issues between the first wafer 200 and second wafer 300 may be reduced.

Accordingly, the present disclosure provides a semiconductor structure as shown in FIG. 7. The semiconductor structure may include a first wafer 200, a first metal layer 200 in the first wafer 202 and having an exposed top surface, and a first material layer 206 on the surface of the first wafer 200. The first material layer 206 and the first metal layer 202 are located on the same side/surface of the first wafer 200.

The semiconductor structure may further include a second wafer 300, a second metal layer 300 in the second wafer 302 and having an exposed top surface, and a second material layer 306 on the surface of the second wafer 300. The second material layer 306 and the second metal layer 302 are located on the same side/surface of the second wafer 300.

The first wafer 200 having the first material layer 206 may be bonded with the second wafer 300 having the second material layer 306. The first material layer 206 and the second material layer 306 may be aligned and in contact with one another. A second alignment accuracy may be provided between the first metal layer 202 and the second metal layer 302. The top surface of the first metal layer 202 and the surface of the first wafer 200 may be coplanar with one another. Alternatively, the top surface of the first metal layer 202 may be above (higher than) the surface of the first wafer 200. The top surface of the second metal layer 302 and the surface of the second wafer 300 may be coplanar with one another. The top surface of the second metal layer 302 may be higher than the surface of the second wafer 300.

In one embodiment, the first material layer 206 may partially or wholly cover the top surface of the first metal layer 202. The second material layer 306 may partially or wholly cover the top surface of the second metal layer 302. Each of the first material layer 206 and the second material layer 306 may be conductive.

In one embodiment as shown in FIG. 7, the first material layer 206 and the first metal layer 202 may have same dimensions/area. The first material layer 206 may cover only the top surface of the first metal layer 202. The second material layer 306 and the second metal layer 302 may have same dimensions/area. The second material layer 306 may only cover the top surface of the second metal layer 302. The first material layer 206 and the second material layer 306 may have corresponding sidewall surfaces completely aligned.

In another embodiment as shown in FIG. 8, the first material layer 206 may have a dimension/area larger than the first metal layer 202. That is, in addition to covering the top surface of the first metal layer 202, the first material layer 206 may also cover surface portions of the first wafer 200. The second material layer 306 may have a dimension/area larger than the second metal layer 302. In addition to covering the top surface of the second metal layer 302, the second material layer 306 may also cover surface portions of the second wafer 300. The first material layer 206 and the second material layer 306 may have corresponding sidewall surfaces completely aligned.

In other embodiments as shown in FIG. 9, the first material layer 206 and the second material layer 306 may be aligned in a fashion that corresponding sidewall surfaces are not completely aligned, e.g., do not form a vertical plane as shown in FIG. 7.

Various embodiments of the present disclosure further include another exemplary method of making a semiconductor structure. FIG. 10 to FIG. 15 illustrates a cross-sectional view of the semiconductor structure at various stages during its formation.

Figure 10:
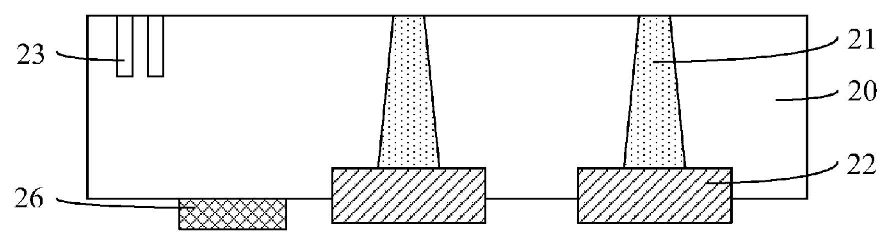
FIGS. 10-15 depict another exemplary method for forming a semiconductor device in accordance with various disclosed embodiments.

In FIG. 10, a first wafer 20 is provided. The first wafer 20 includes a first surface and a second surface opposing to the first surface. A first metal layer 22 is formed in the first wafer 20 and having a top surface protruded over the top surface of the first wafer 200.

A first material layer 26 is formed on the first surface of the first wafer 20. The first material layer 26 and the first metal layer 22 are located on a same side/surface of the first wafer 20.

In one embodiment, the first material layer 26 is not formed on the first metal layer 22 but formed on the first surface of the first wafer 20 that is not covered by the first metal layer 22. As such, there is no need to rely on conductive properties of the first material layer 26 to provide an electrical connection between the first metal layer 22 and a subsequently-formed second metal layer. In this case, the first material layer 26 may be made of an insulating material or a conductive material.

The top surface of the first metal layer 22 may be higher than the first surface of the first wafer 20, which, after the bonding process, reduces distance between the first metal layer 22 and the subsequently-formed second metal layer. The reduced distance may facilitate to further reduce process difficulties of the bonding process. In other embodiments, the top surface of first metal layer may be lower than or flush with the first surface of the first wafer.

After subsequently providing the second wafer, a second material layer may be formed on the surface of the second wafer. The first material layer 26 and the second material layer may have a low melting point. Specifically, when a heating process is subsequently conducted on the first material layer 26 and the second material layer, the first material layer 26 and the second material layer may be in a molten state, which provides a surface tension between the first material layer 26 and second material layer. Such surface tension may pull the first material layer 26 and the second material layer to get closer, thus improving alignment accuracy between the first wafer 20 and second wafer.

In one embodiment, as similarly described above, the melting point of the first material layer 26 may be directly related to temperatures used for the subsequent bonding process and heating process. For example, the first material layer 26 may have a melting point ranging from about 100° C. to about 350° C. In a specific embodiment, the first material layer 26 may be formed by a tin-silver alloy. The first material layer 26 may be made of same material as for the first material layer 206 and may include any suitable alloy(s) having a low melting point. In other embodiments, when the first material layer is made of an insulating material, the first material layer may have a melting point ranging from about 100° C. to about 350° C. The first material layer may be a resin material, e.g., an epoxy resin or a polypropylene resin.

When the thickness of the first material layer 26 is too thin, in a subsequent bonding process, the first metal layer 22 and the second metal layer may be undesirably bonded. This may cause difficulties in further aligning the first metal layer 22 and the second metal layer during the subsequent heating process. When the thickness of the first material layer 26 is too thick, after the subsequent bonding process, a distance between the top surface of the first metal layer 22 and the top surface of the second metal layer is too high, resulting in further difficulties in the following bonding process. As such, in one embodiment, the thickness of the first material layer 26 is greater than the distance between the top surface of the first metal layer 22 and the first surface of the first wafer 20. In a specific embodiment, a distance from the top surface of the first metal layer 22 to the first surface of the first wafer 20 may be about 0.05 microns, while the thickness of the first material layer 26 may be about 0.1 micrometers to about 10 micrometers.

In one embodiment, the first material layer 206 is formed by forming a first patterned photoresist layer on the first surface of the first wafer 20 to cover the surface of the first metal layer. The first material layer 26 is formed on the uncovered surface of the first wafer 20, followed by removal of the first patterned photoresist layer.

Figure 11:
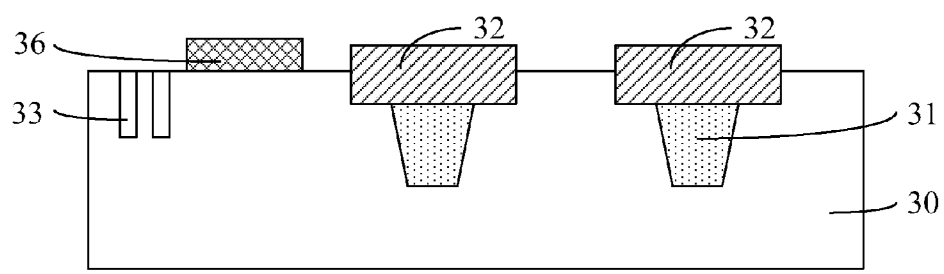

In FIG. 11, a second wafer 30 is provided having a third surface and a fourth surface opposing the third surface. A second metal layer 32 is formed in the second wafer 30 and has a top surface protruded over the third surface of the second wafer 30. A second material layer 36 is formed on the third surface of the second wafer 30. The second material layer 36 and the second metal layer 32 are located on the same side/surface of the second wafer 30.

In one embodiment, the second material layer 36 is formed on the third surface of the second wafer 30 that is not covered by the top surface of the second metal layer 32. The second material layer 36 may be an insulating material or a conductive material.

The top surface of the second metal layer 32 may be higher than the third surface of the second wafer 30. In other embodiments, the top surface of the second metal layer 32 may be flush or coplanar with the third surface of the second wafer 30. The second material layer 36 may have a melting point ranging from about 100° C. to about 350° C. In various embodiments, the second material layer 36 and the first material layer 26 may be the same or different.

After the subsequent bonding process, a gap occurs between the top surface of the first metal layer 22 and the top surface of the second metal layer 32. A first distance is determined from the top surface of the first metal layer 22 to the first surface of the first wafer 20. A second distance is determined from the top surface of the second metal layer 32 to the third surface of the second wafer 30. It is required that a total thickness of the first material layer 26 and the second material layer 36 is greater than a total of the first distance and the second distance. In one embodiment, the thickness of the second material layer 36 is greater than a distance between the top surface of the second metal layer 32 and the third surface of the second wafer 30.

In one embodiment, the second material layer 36 and the first material layer 26 may have same dimensions and/or materials. A distance between the first metal layer 22 and the first material layer 26 may be the same distance between the second metal layer 32 and the second material layer 36.

Figure 12:
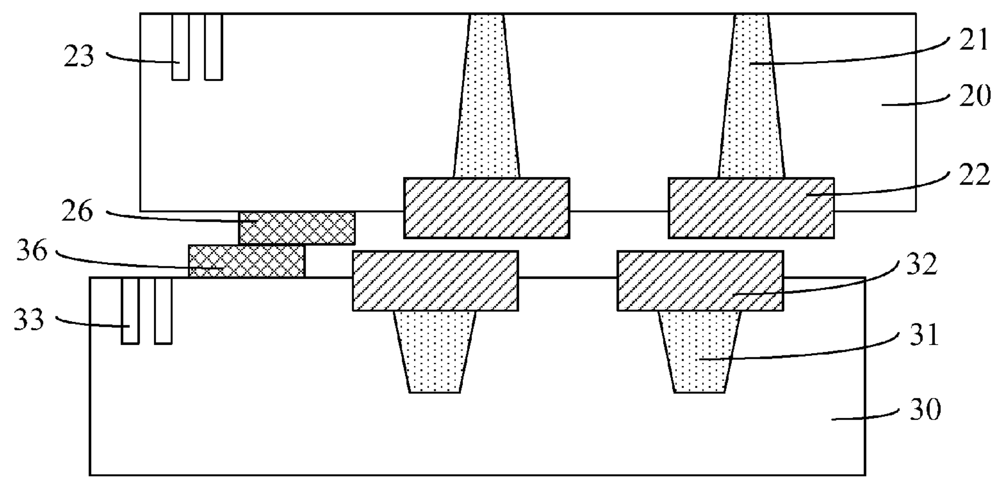

In FIG. 12, an alignment process may be performed between the first wafer 20 and second wafer 30 by aligning the first material layer 26 with the second material layer 36. After the alignment process, a bonding process is performed between the first wafer 20 and second wafer 30 to allow the first material layer 26 and the second material layer 36 to be aligned and to be in contact. The first metal layer 22 and the second metal layer 32 may provide the first alignment accuracy.

In the alignment process, by aligning a first alignment structure 23 with a second alignment structure 33, the first wafer 20 and second wafer 30 may be aligned. However, due to process limitations of the alignment process and due to increasingly shrunk size of the semiconductor structure, it is difficult to completely align the first wafer 20 with the second wafer 30. A complete alignment refers to: after performing the alignment process, corresponding sidewall surfaces of the first metal layer 22 and second metal layer 32 are flush or coplanar with one another. In some cases, the aligned sidewall surfaces may be vertical with respect to surface of the semiconductor substrate.

In an actual production process, after the bonding process, corresponding sidewall surfaces of the first material layer 26 and the second material layer 36 are not coplanar with one another and may have a distance between corresponding sidewalls of the metal layer 22 and the second metal layer 32. The first alignment accuracy needs to be further improved.

In one embodiment, thermo-compression bonding process may be used for the bonding process. In this case, the bonding process may be carried out in the first temperature. When the first temperature is too low, the bonding strength between the first material layer 26 and the second material layer 36 may be too low. During subsequent processes, the first material layer 26 and the second material layer 36 may be easily separated from one another. When the first temperature is too high, the first material layer 26 and the second material layer 36 may be melted and fused into one another during the bonding process. In one embodiment, the first temperature is less than the melting point of the first material layer 26 and the second material layer 36. In a specific embodiment, the first temperature is about 100° C. to about 250° C.

During the bonding process, a first pressure may be applied on the backside (e.g., the second surface) of the first wafer 20 in a direction from the backside surface or the second surface of the first wafer 20 to the front-side surface or the first surface of the first wafer 20.

When the first pressure is too low, the bonding strength between the first material layer 26 and the second material layer 36 may be too week. When the first pressure is too high, it may cause undesirable bonding between surfaces of the first metal layer 22 and the second metal layer 32. In one embodiment, the first pressure may be from about 1 kN to about 20 kN.

After the bonding process, the first metal layer 22 and the second metal layer 32 may be in close contact with one another. Certain bonding strength may be established between the first metal layer 22 and the second metal layer 32. When the first material layer 26 and the second material layer 36 subsequently provide a surface tension to pull the first material layer 26 and the second material layer 36 closer, since the first metal layer 22 and the second metal layer 32 already have the certain bonding strength therebetween, it is difficult for the first metal layer 22 and the second metal layer 32 to move with respect to one another. Such surface tension may not be able to improve alignment accuracy between the first wafer 20 and second wafer 30.

In one embodiment, after performing the bonding process, a gap may be required between the top surface of the first metal layer 22 and the top surface of the second metal layer 32 to prevent the top surface of the first metal layer 22 and the top surface of the second metal layer 32 in close contact during the bonding process.

Figure 13:
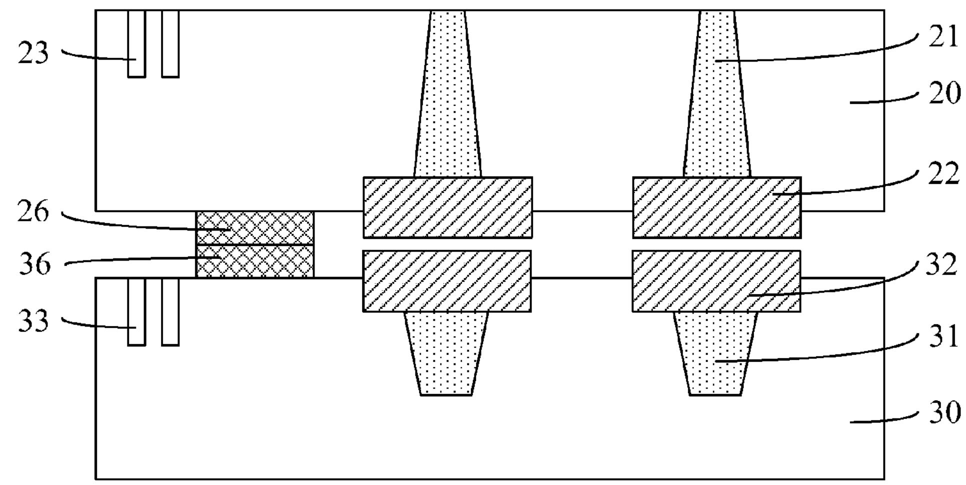

In FIG. 13, after performing the bonding process, a heating process is performed on the first material layer 26 and the second material layer 36 for the first material layer 26 and the second material layer 36 to melt or fuse into one another to provide alignment accuracy between first the metal layer 22 and the second metal layer 32 having a second, and the second alignment accuracy is greater than the first alignment accuracy, so that first metal layer 22 and the second metal layer 32 are aligned with one another.

The heating process may be carried out at a second temperature. The second temperature is greater than melting point(s) of the first material layer 26 and the second material layer 36. In one embodiment, first material layer 26 and second material layer 36 have a melting point greater than the first temperature and less than the second temperature.

During the heating process, the first material layer 26 and the second material layer 36 may be in a molten state, and the first material layer 26 and the second material layer 36 may be melted and fused into one another to provide a surface tension there-between. The first material layer 26 and the second material layer 36 may thus be pulled closer with one another under the surface tension, thus pulling the first metal layer 22 and the second metal layer 32 to be closer, to improve alignment accuracy: between the first material layer 26 and the second material layer 36, between the first metal layer 22 and second metal layer 32, and between the first wafer 20 and the second wafer 30. Such second alignment accuracy is greater than the first alignment accuracy to reduce or eliminate the bonding shift issues.

When the second temperature is too low, the first material layer 26 and the third material layer 36 may not be able to melt. When the second temperature is too high, the device within the semiconductor structure may be damaged. In one embodiment, the second temperature is about 200° C. to about 350° C.

In an example, after the heating process, the first material layer 26 and the second material layer 36 may be completely aligned. In other words, the first material layer 26 and the second material layer 36 may be completely aligned to provide coplanar sidewalls, and thus to provide coplanar sidewalls for the first metal layer 22 and the second metal layer 32. In this case, the second alignment accuracy is approximately 100%.

In another embodiment, first material layer 26 and the second material layer 36 in the molten state has limited surface tension, after the heating process, first material layer 26 is completely aligned with the second material layer 36 does not reach the side walls, namely first metal layer 22 and the second metal layer 32 is not fully aligned compared to the previous heating process, first metal layer 22 and alignment 32 between the second metal layer accuracy is improved, so that the first wafer 20 and second wafer between 30 alignment accuracy is improved. Therefore, even after the heating process first metal layer 22 and the second metal layer 32 is not completely aligned, in terms of comparison to the prior art, the present embodiment is still improved between the first wafer 20 and the second wafer 30 in alignment accuracy, reducing the bonding shift.

Figure 14:
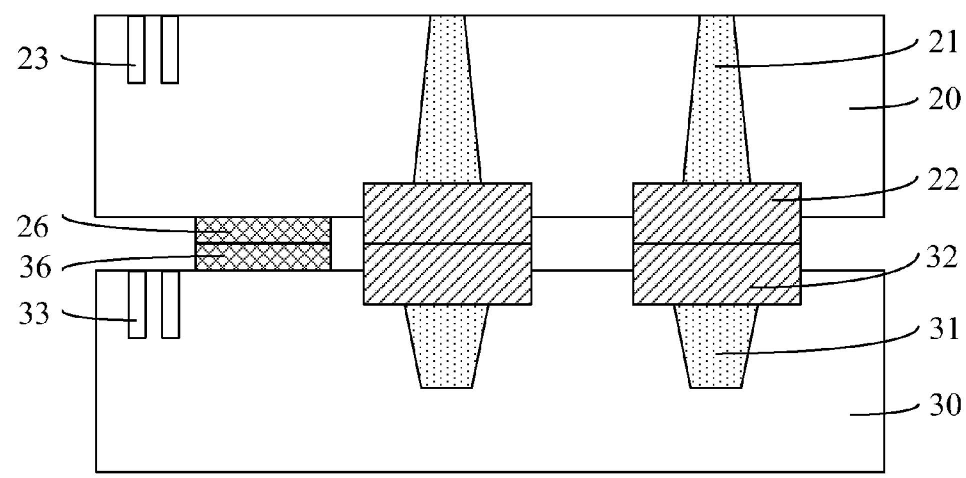

In FIG. 14, after the heating process, a second bonding process is performed between the first wafer 20 and second wafer 30, such that the first metal layer 22 and the top surface of the second metal layer 32 are in contact. The first metal layer 22 and the second metal layer 32 may still provide the second alignment accuracy there-between.

After heating process, a gap still exists between the top surface of the first metal layer 22 and the top surface of the second metal layer 32, and no electrical connection between the first metal layer 22 and the second metal layer 32. The second bonding process after the heating process may further allow first metal layer 22 and the second metal layer 32 to be in close contact.

The second bonding process may include a thermo-compression bonding process. The second bonding process may be performed at a third temperature. During the second bonding process, a second pressure is applied onto the second surface of the first wafer 20, and the second pressure is applied in a direction from the second surface of first wafer 20 to the first surface of the first wafer 20. The second pressure is greater than the first pressure. In a certain embodiment, the second pressure ranges from about 10 kN to about 100 kN.

When the third temperature is too low, bonding strength between surfaces of the first metal layer 22 and the second metal layer 32 is too low. When the third temperature is too high, the high temperature may damage device(s) within the semiconductor structure. Additionally, at high temperatures, the first material layer 26 and second material layer 36 may be easy to reach a molten state. In one embodiment, the third temperature ranges from about 100° C. to about 250° C.

Compared with conventional structures and methods, the disclosed structures and methods significantly improve alignment accuracy between the first metal layer 22 and the second metal layer 32 and between the first wafer 20 and the second wafer 30, thus reduce or eliminate the bonding shift.

In one embodiment as shown in FIG. 14, before the second bonding process, the first material layer 26 and the second material layer 36, the first metal layer 22 and the second metal layer 32, are completely aligned. For example, corresponding sidewall surfaces of the first metal layer 22 and the second metal layer 32 may be coplanar with one another. After the second bonding process, in addition to providing coplanar sidewall surface, the first metal layer 22 and the second metal layer 32 may further be in close contact. During the second bonding process, under the second pressure and at the third temperature, the first material layer 26 and second material layer 36 may have a reduced thickness and an increased area.

Figure 15:
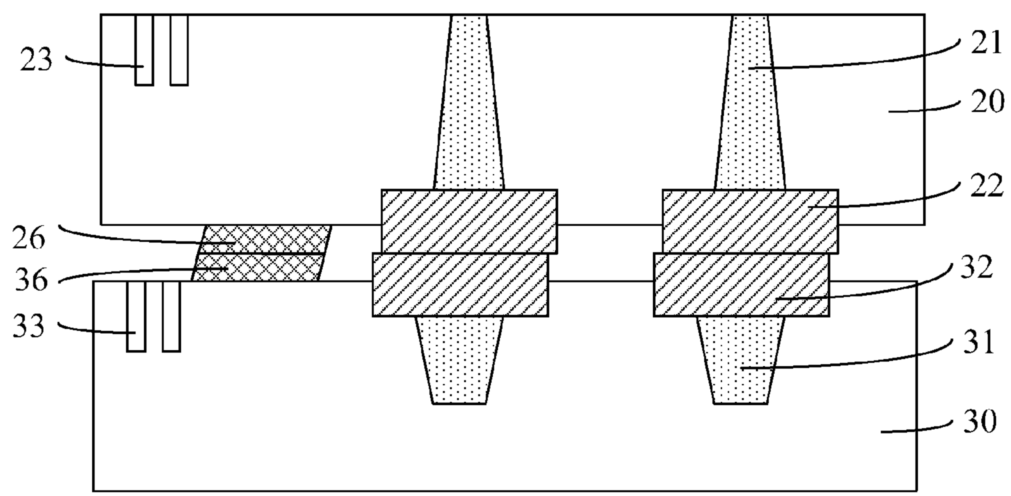

In another embodiment as shown in FIG. 15, before the second bonding process, the first material layer 26 and the second material layer 36, the first metal layer 22 and the second metal layer 32, are not completely aligned. For example, a distance exists between sidewall surfaces of the first metal layer 22 and the second metal layer 32. After the second bonding process, a distance still exists between sidewall surfaces of the first metal layer 22 and the second metal layer 32.

In this case, even though the first metal layer 22 and the second metal layer 32 are not completely aligned, the disclosed structures and methods may significantly improve alignment accuracy between the first metal layer 22 and the second metal layer 32 and between the first wafer 20 and the second wafer 30, as compared with conventional structures and methods. Bonding shift between the first wafer 20 and the second wafer 30, and issues caused by the bonding shift may be reduced.

Meanwhile, in one embodiment, a distance from the first material layer 26 to the first metal layer 22, and a distance from the second material layer 36 to the second metal layer 32 may be set desirably far away to prevent the first material layer 26 and the second material layer 36 from affecting electrical properties of first metal layer 22 and the second metal layer 32. Further, after the second bonding process, the first material layer 26 and the second material layer 36 may have increased dimensions/area, as dimensions/area of the semiconductor structure shrink, distance between adjacent first metal layers 22 and between adjacent second metal layers 32 may be smaller and smaller. In one embodiment, the first material layer 26 is formed on the top surface of the first metal layer 22, while the second material layer 36 is not formed on the top surface of the second metal layer 32. This may avoid electrical connection problems caused by increased dimensions/area of the first material layer 26 and the second material layer 36.

Accordingly, the present disclosure provides a semiconductor structure. Referring back to FIG. 14, the semiconductor structure may include: a first wafer 20, a first metal layer 22 located in first wafer 20 and having a top surface protruded over the surface of the first wafer 20, and a first material layer 26 on the first wafer 20. The first material layer 26 and the first metal layer 22 are located on a same side/surface of the first wafer 20.

The semiconductor structure may also include a second wafer 30, second metal layer 32 located in the second wafer 30 and having a top surface protruded over the surface of the second wafer 30, and a second material layer 36 on the second wafer 30. The second material layer 36 and the second metal layer 32 are located on the same side/surface of the second wafer 30. The first wafer 20 having the first material layer 26 is surface bonded with the second wafer 30 having the second material layer 36. The first material layer 26 and the second material layer 36 are aligned and in contact with one another. The first metal layer 22 and the second metal layer 32 provide a second alignment accuracy there-between.

For illustration purposes, the present disclosure is described that the top surface of the first metal layer 22 is protruded above or higher than the top surface of the first wafer 20, and that the top surface of the second metal layer 32 is protruded above or higher than the top surface of the second wafer 30. In other embodiments, the top surface of the first metal layer is coplanar with the top surface of the first wafer, and that the top surface of the second metal layer is coplanar with the top surface of the second wafer 30.

In one embodiment, the first material layer 26 is located on the top surface of the first wafer 20 that is not covered by the first metal layer 22. The second material layer 36 is located on the top surface of the second wafer 30 that is not covered by the second metal layer 32. The first material layer 26 and the second material layer material 36 are made of an insulating material or a conductive material. The top surface of the first metal layer 22 and the top surface of the second metal layer 32 are bonded with one another. The first material layer 26 and the second material layer 36 are in contact with one another.

In one embodiment as shown in FIG. 14, the first material layer 26 and the second material layer 36 may have coplanar sidewall surfaces, the first metal layer 22 and the second metal layer 32 may also have coplanar sidewall surfaces. The second alignment accuracy may be approximately 100%.

In another embodiment as shown in FIG. 15, the first material layer 26 and the second material layer 36 are not vertically coplanar with one another, but may be coplanar to some extent. Corresponding sidewalls of the first metal layer 22 and the second metal layer 32 may not be completely aligned. Portions of the first metal layer 22 and the second metal layer 32 may be miss-aligned with some bonding shift.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor structure, comprising:

providing a first wafer and a second wafer, wherein a first metal layer is formed in the first wafer and has a top surface exposed, and a second metal layer is formed in the second wafer and has a top surface exposed;

forming a first material layer on the first wafer, wherein the first material layer and the first metal layer are on a same side of the first wafer, and the first material layer is formed on the first wafer that is outside of the top surface of the first metal layer;

forming a second material layer on the second wafer, wherein the second material layer and the second metal layer are on a same side of second wafer, the second material layer is formed on the second wafer that is outside of the top surface of the second metal layer;

performing an alignment process and a bonding process of the first wafer and the second wafer, such that the first material layer and the second material layer are aligned and in contact with each other to provide a first alignment accuracy between the first metal layer and second metal layer;

applying a first pressure on a backside of the first wafer during the bonding process;

after the bonding process, performing a heating process on the first material layer and the second material layer, such that the first material layer and the second material layer are melted into each other, outside of the top surfaces of the first and second metal layers respectively, to provide a second alignment accuracy between the first metal layer and second metal layer, wherein the second alignment accuracy is greater than the first alignment accuracy;

after performing the heating process, performing a second bonding process between the first wafer and the second wafer, such that surfaces of the first metal layer and the second metal layer are in contact; and applying a second pressure on the backside of the first wafer during the second bonding process, wherein the second pressure is applied in a direction from the backside of the first wafer to a front surface of the first wafer, and the second pressure is greater than the first pressure.

2. The method of claim 1, wherein:

each of the first material layer and the second material layer includes one of an insulating material or a conductive material.

3. The method of claim 1, wherein:

after performing the bonding process, the top surface of the first metal layer is separated from the top surface of the second metal layer by a gap.

4. The method of claim 1, further including:

applying a first pressure on a backside of the first wafer during the bonding process.

5. The method of claim 1, wherein:

the first pressure ranges from about 1 kN to about 20 kN.

6. The method of claim 1, wherein, after performing the heating process, further including:

performing a second bonding process between the first wafer and the second wafer, such that surfaces of the first metal layer and the second metal layer are in contact.

7. The method of claim 1, wherein:

the second pressure ranges from about 10 kN to about 100 kN.

8. The method of claim 1, wherein:

the bonding process is carried out at a first temperature, the heating process is carried out at a second temperature, and the first temperature is less than the second temperature.

9. The method of claim 8, wherein:

the first temperature is about 100° C. to about 250° C., and the second temperature is about 200° C. to about 350° C.

10. The method of claim 1, wherein:

forming a first alignment structure in the first wafer, forming a second alignment structure in the second wafer, and performing the alignment process by aligning the second alignment structure within the second wafer with the first alignment structure in the second alignment structure.

* * * * *